US009274439B2

(12) United States Patent
Zordan

(10) Patent No.: US 9,274,439 B2
(45) Date of Patent: Mar. 1, 2016

(54) RETICLE CLAMPING SYSTEM

(75) Inventor: Enrico Zordan, Norwalk, CT (US)

(73) Assignee: ASML HOLDING N.V., Veldhoven (NL)

( * ) Notice: Subject to any disclaimer, the term of this patent is extended or adjusted under 35 U.S.C. 154(b) by 560 days.

(21) Appl. No.: 13/168,109

(22) Filed: Jun. 24, 2011

(65) Prior Publication Data

US 2012/0002187 A1    Jan. 5, 2012

Related U.S. Application Data

(60) Provisional application No. 61/360,316, filed on Jun. 30, 2010, provisional application No. 61/418,165, filed on Nov. 30, 2010.

(51) Int. Cl.
*G03B 27/60* (2006.01)
*G03B 27/64* (2006.01)
*G03B 27/32* (2006.01)
*G03F 7/20* (2006.01)
*G03B 27/42* (2006.01)

(52) U.S. Cl.
CPC ...................................... *G03F 7/707* (2013.01)

(58) Field of Classification Search
CPC . G03F 7/70691; G03F 7/707; G03F 7/70708; G03F 7/70733; G03F 7/70783; G03F 7/70791
USPC ........... 355/30, 52, 53, 55, 72–77; 250/492.1, 250/492.2, 492.22, 548; 430/5, 8, 22, 30, 430/311, 312
See application file for complete search history.

(56) References Cited

U.S. PATENT DOCUMENTS

| | | | | |
|---|---|---|---|---|
| 4,391,511 A * | 7/1983 | Akiyama et al. | ................. | 355/40 |
| 5,967,159 A * | 10/1999 | Tateyama | ......................... | 134/61 |
| 6,653,024 B1 * | 11/2003 | Shiraishi et al. | ................... | 430/5 |
| 6,721,035 B1 * | 4/2004 | Segers et al. | ..................... | 355/53 |

(Continued)

FOREIGN PATENT DOCUMENTS

| | | |
|---|---|---|
| EP | 1 031 877 | 8/2000 |
| JP | S56-130738 | 10/1981 |

(Continued)

OTHER PUBLICATIONS

Japanese Office Action mailed Mar. 19, 2015 in corresponding Japanese Patent Application No. 2011-139030.

*Primary Examiner* — Christina Riddle
(74) *Attorney, Agent, or Firm* — Pillsbury Winthrop Shaw Pittman LLP

(57) ABSTRACT

A support structure for positioning an exchangeable object (e.g., patterning device) in a lithographic apparatus. The support structure has a chuck and at least two clamp mechanisms spaced from one another in a first direction. Each clamp mechanism has a plurality of vacuum sections to support the object and apply a localized clamping force to the object to hold the object. The separation between the vacuum sections is in a second direction different from the first direction. The support structure may have a chuck and a clamp mechanism having a plurality of clamp sections to support the object and apply a clamping force to the object. The sections may move relative to each other. Each section may include a channel to communicate a low pressure to hold the object. The stiffness of the clamp mechanism(s) reduces and/or avoids stress and/or slip at the interface of the chuck/clamp and object.

20 Claims, 10 Drawing Sheets

(56) References Cited

U.S. PATENT DOCUMENTS

| | | | |
|---|---|---|---|
| 6,927,839 B2 * | 8/2005 | Taniguchi et al. | 355/72 |
| 7,006,201 B2 * | 2/2006 | Uemura | 355/73 |
| 7,196,775 B2 * | 3/2007 | Galburt | 355/75 |
| 8,284,379 B2 * | 10/2012 | Phillips | 355/72 |
| 2004/0080734 A1 | 4/2004 | Taniguchi et al. | |
| 2004/0100624 A1 * | 5/2004 | Hagiwara et al. | 355/72 |
| 2007/0268476 A1 * | 11/2007 | Phillips et al. | 355/75 |
| 2008/0291411 A1 * | 11/2008 | Phillips | 355/52 |

FOREIGN PATENT DOCUMENTS

| | | |
|---|---|---|
| JP | S57-034336 | 2/1982 |
| JP | S57-058319 | 4/1982 |
| JP | S57-072323 | 5/1982 |
| JP | H10-316243 | 12/1998 |
| JP | H11-143053 | 5/1999 |
| JP | H11-305419 | 11/1999 |
| JP | 2000-323406 | 11/2000 |
| JP | 2004-158847 | 6/2004 |
| JP | 2005-003799 | 1/2005 |
| JP | 2006-060241 | 3/2006 |
| JP | 2010-527139 | 8/2010 |
| KR | 10-2004-0034506 | 4/2004 |
| TW | 277836 | 4/2007 |
| WO | 99/24889 | 5/1999 |
| WO | 02/065519 | 8/2002 |

* cited by examiner

RETICLE CLAMPING SYSTEM

This application claims priority and benefit under 35 U.S.C. §119(e) to U.S. Provisional Patent Application Ser. No. 61/360,316, entitled "Reticle Clamping System", filed on Jun. 30, 2010, and to U.S. Provisional Patent Application Ser. No. 61/418,165, entitled "Reticle Clamping System", filed on Nov. 30, 2010. The contents of those applications are incorporated herein in their entirety by reference.

FIELD

The present invention relates to a lithographic apparatus and a reticle clamping system.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by other mechanisms, such as by stamping or imprinting the pattern onto the substrate.

It is known to hold an object, such as a patterning device, in the lithographic apparatus by placing the patterning device on a clamp having one or more vacuum pads and applying a vacuum to pull and generate a normal force between the patterning device and the vacuum pad. The normal force then generates friction force between the vacuum pad and the patterning device.

SUMMARY

Generally known systems for clamping are limited due to their stiffness and limited deformation abilities at the interface between the clamp and the object to be clamped, such as during acceleration of the object. As a result, the clamp can apply up to a certain force to the object (e.g., patterning device) before creating localized stress points at the information and thereby inducing slip in the clamping system. Current accelerations and speeds of objects can reduce the grip of the clamp on the object. There is a desire to be able to increase accelerations and speeds to increase throughput of exposed substrates, and thus, to increase and/or maximize the grip at the clamp-object interface.

In one embodiment of the invention, there is provided a support structure for positioning an exchangeable object in a lithographic apparatus. The support structure has a chuck constructed to hold an exchangeable object, and at least two clamp mechanisms disposed on the chuck. The clamp mechanisms are spaced from one another in a first direction. Each clamp mechanism has a plurality of separate vacuum sections constructed and arranged to support the exchangeable object and apply a clamping force to the exchangeable object to hold the exchangeable object. The separation between the vacuum sections is in a second direction different from the first direction.

According to an aspect of the invention, there is provided a lithographic apparatus arranged to transfer a pattern from a patterning device onto a substrate, and the patterning device is configured to provide a patterned beam of radiation. The apparatus has an illumination system configured to provide a beam of radiation; a support structure configured to support the patterning device comprising the pattern; a projection system configured to project the patterned beam onto a target portion of the substrate; a substrate table configured to support the substrate; and at least two clamp mechanisms disposed on the support structure. The clamp mechanisms are spaced from one another in a first direction. Each clamp mechanism has a plurality of separate vacuum sections constructed and arranged to support the exchangeable object and apply a clamping force to the exchangeable object to hold the exchangeable object. The separation between the vacuum sections is in a second direction different from the first direction.

According to another aspect of the invention, there is provided a method for positioning an object within a lithographic apparatus. The method includes: loading the object onto a chuck of the lithographic apparatus and applying a clamping force to the object to hold the object at a position with respect to the chuck. The clamping force is applied by at least two clamp mechanisms disposed on the chuck, the clamp mechanisms being spaced from one another in a first direction, and each clamp mechanism having a plurality of separate vacuum sections constructed and arranged to support the exchangeable object and apply the clamping force, the separation between the vacuum sections being in a second direction different from the first direction.

In yet another aspect of the invention, there is provided a clamp assembly for holding an exchangeable object in a lithographic apparatus. The clamp assembly has at least two clamp mechanisms spaced from one another in a first direction. Each clamp mechanism has a plurality of separate vacuum sections constructed and arranged to support the exchangeable object and apply a clamping force to the exchangeable object to hold the exchangeable object. The separation between vacuum sections is in a second direction that is different from the first direction.

Accordingly, it would be advantageous, for example, to provide a support structure for positioning an exchangeable object in a lithographic apparatus. The support structure has a chuck constructed to hold an exchangeable object, and a clamp mechanism on the chuck. The clamp mechanism has a plurality of clamp sections to support the exchangeable object and apply a clamping force to the exchangeable object to hold the exchangeable object at a position with respect to the chuck.

According to an aspect of the invention, there is provided a lithographic apparatus arranged to transfer a pattern from a patterning device onto a substrate, and the patterning device is configured to provide a patterned beam of radiation. The apparatus has a chuck constructed to hold an exchangeable object, and a clamp mechanism on the chuck. The clamp mechanism has a plurality of clamp sections to support the exchangeable object and apply a clamping force to the exchangeable object to hold the exchangeable object at a position with respect to the chuck.

According to another aspect of the invention, there is provided a method for positioning an object within a lithographic apparatus. The method includes: loading the object onto a chuck of the lithographic apparatus and applying a clamping force to the object to hold the object at a position with respect to the chuck. The clamping force is applied by at least one clamping mechanism that is divided into a plurality of sections, each section being movable relative to adjacent sections.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
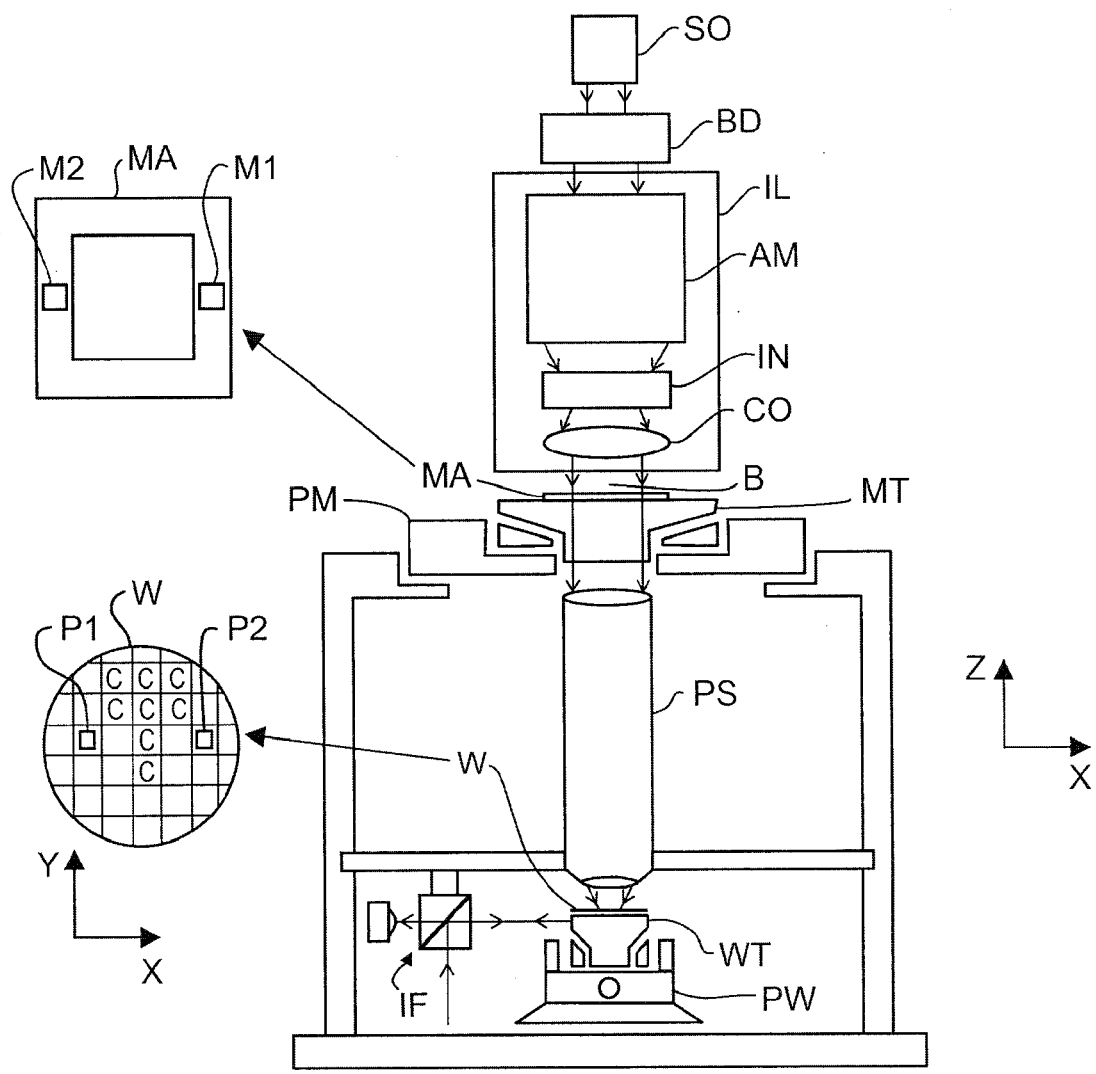
FIG. 1 schematically depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to hold a patterning device (e.g. a mask or a reticle) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables/support structure may be used in parallel, or preparatory steps may be carried out on one or more tables/support structure while one or more other tables/support structures are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table. WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

While the discussion herein focuses on a patterning device, the structures, methods and concepts discussed herein may be suitably applied to one or more other objects. The patterning device is an embodiment of such an object.

Figure 2:
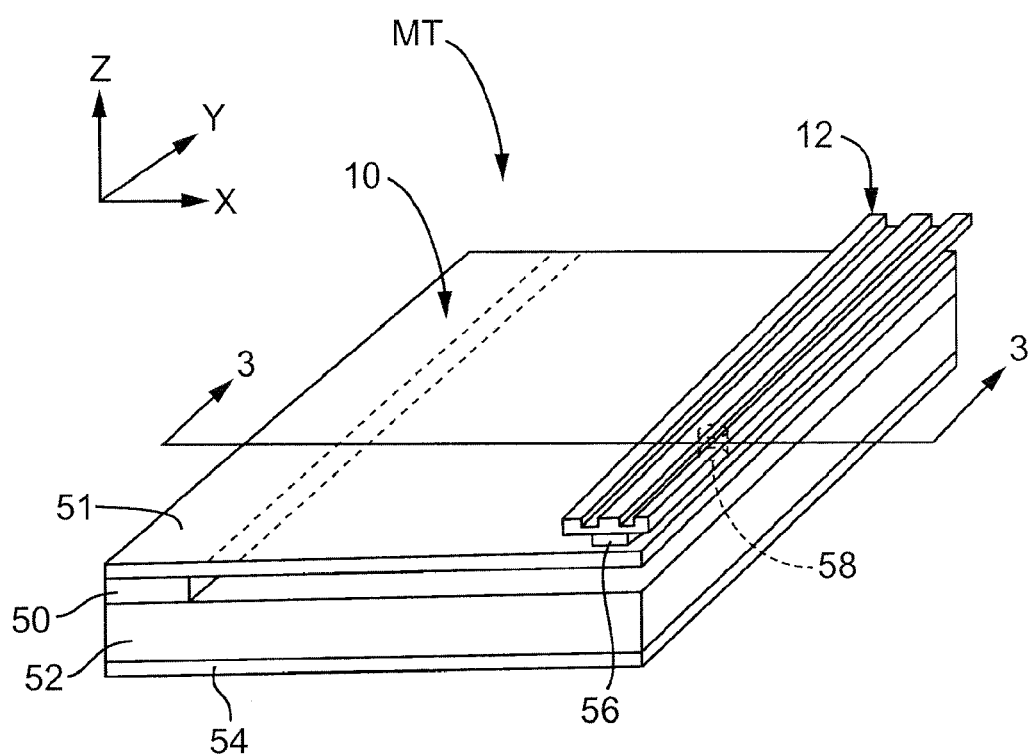
FIG. 2 schematically depicts a perspective view of part of a support structure to support an object.

As discussed above, a patterning device is typically held by a support structure MT. Support structure MT, as shown in greater detail in FIGS. 2-5, may include, for example, a chuck 10 and a clamp mechanism 12. Chuck 10 may comprise any number of parts and should not be limiting. For example, in the illustrated embodiment, chuck 10 comprises a number of components connected by structural bonds. The bonds may be generally stiff to connect the components, for example. The bonds may comprise any number of materials and may also be damping or constraining elements (or layers) in chuck 10. In another embodiment, chuck 10 may comprise a single (one) component and thus bonds are not necessary. For explanatory purposes, a first (or left) side of the chuck 10 is shown. The illustrated first side of chuck 10 comprises a carrier 52 which may be part of chuck 10 or rigidly connected via a bond 54 to a part (not shown) of chuck 10. Chuck 10 may also comprise a leaf spring 51 that is connected to carrier 52 via bond 50. As shown by the perspective view of FIG. 2, a support connection 58 may be provided in an area to stiffen the structure with respect to movement in the Z-direction (with respect to the Z-axis). The support connection 58 may be a dot of glue or adhesive, for example.

Clamp 12 may be bonded to leaf spring 51 of chuck 10 via a bond 56, for example. Clamp 12 has the function of holding an object such as a reticle or patterning device MA at a precise and stable position respect to chuck 10 without distorting it. As previously noted, clamp mechanism 12 is generally required to be stiff in the acceleration direction (i.e., the Y-direction along the Y-axis) while being capable of adapting to any non-flatness of the patterning device at a clamp-object interface 14 by being soft in the Z-direction (along the Z-axis). Also, to maximize the grip of clamp 12 on object or patterning device MA, any stress at interface 14 generated by the acceleration in the Y-direction has to be evenly distributed across the whole contact surface.

Figure 3:
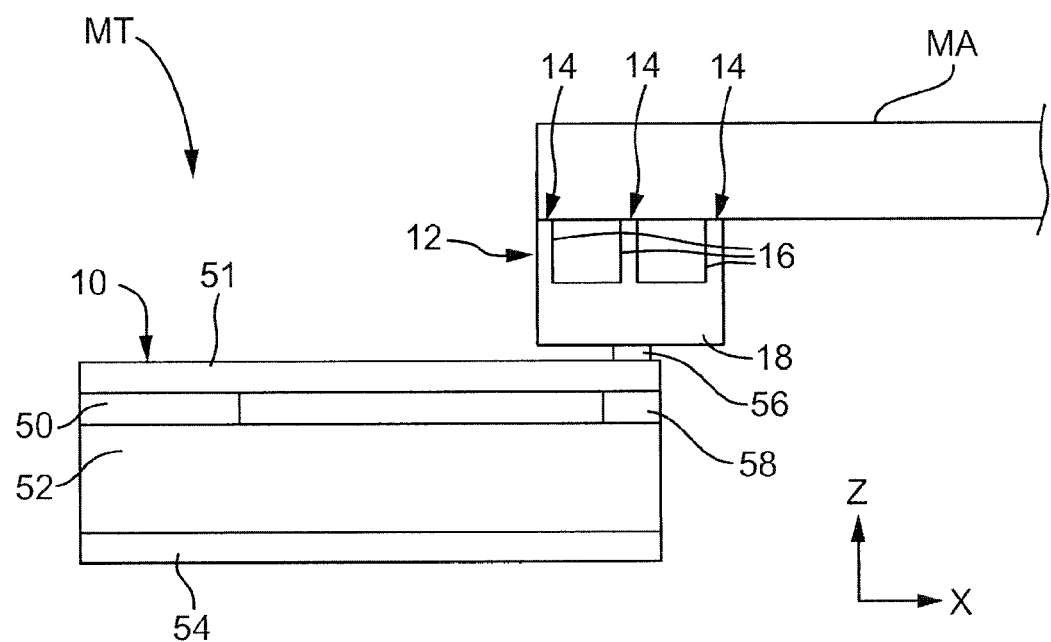
FIG. 3 schematically depicts a sectional view of the support structure of FIG. 2 with a exemplary clamp to support an object.
Figure 4:
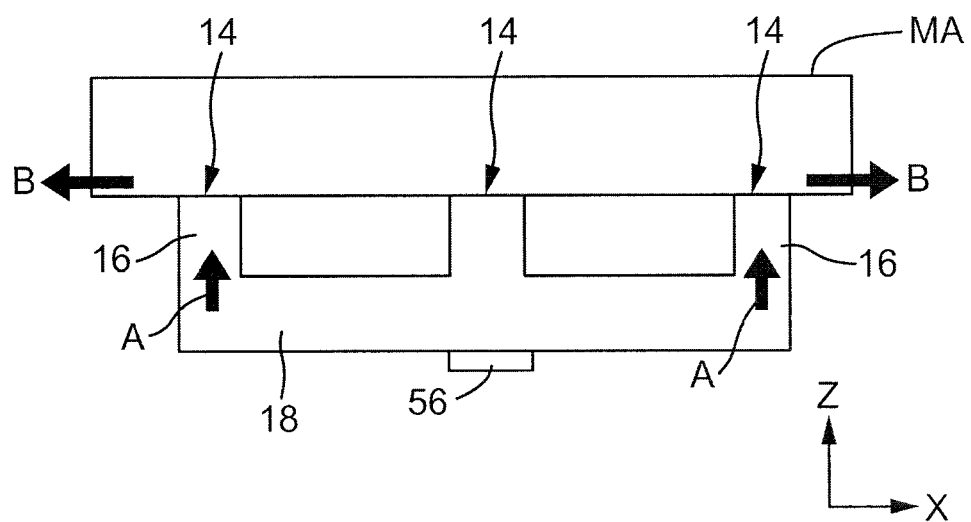
FIGS. 4 and 5 schematically depict sectional views of the exemplary clamp of FIG. 3 as known in the art and a method of handling an object using the exemplary clamp according to an embodiment of the invention.

As shown in more detail in FIG. 4, exemplary clamp 12 as shown in FIG. 3 comprises a "W"-shaped clamp design, representing clamps that are generally known in the art. The W-shaped clamp design has three (3) burls 16 or walls extending from a base 18 of clamp 12 which contact the object MA at a number of interfaces 14. A vacuum force by a vacuum (not shown) may be applied at interfaces 14 to clamp and/or hold the object MA in place on clamp 12. However, problem(s) may arise when a vacuum is applied to clamp 12. For example, as previously noted, clamp 12 is required to adapt to the object's shape along the Z-axis and, in order to do that, the exemplary W-shaped clamp design of FIG. 4 is designed to be soft relative to the object by using the three walls 16. However, softness in the Z-direction contributes to the cause of the change of shape of clamp 12 under vacuum, and extra stress at contact interface 14 (between object MA and clamp 12) is generated (e.g., see FIG. 5). The localized stress at each interface 14 is formed and/or increased due to induced deformation and/or warping of clamp when the vacuum is applied, ultimately reducing the acceleration-induced stress allowable before slip occurs. Also, this may lead to an undesired stress on the object MA which is clamped to clamp mechanism 12. Additionally and/or alternatively, this may also lead to a stress in chuck 10.

Figure 5:
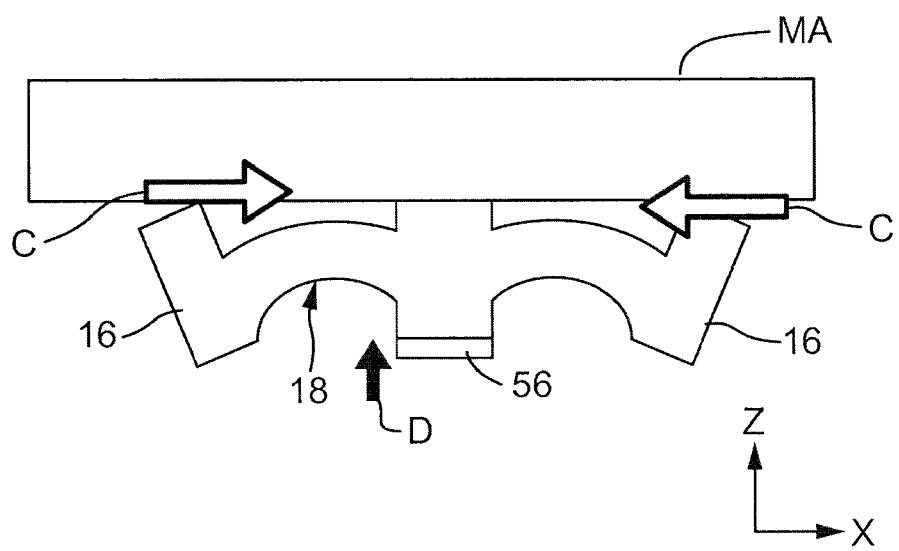

In addition to the stress generated by acceleration in the Y-direction, stress in the X-direction is created by elastic deformation of chuck 10. In general, X-direction stress as depicted in FIG. 5 is originated by two phenomena. First, force or pressure generated by vacuum between clamp 12 and object MA pushes (or draws) at least the end walls 16 against object MA, causing pressure at the interface 14 (see arrows B in FIG. 4). An exertion of vacuum force toward interfaces 14 is depicted as arrows A in FIG. 4 (thus resulting in a pulling or pressurized force in an opposite direction of arrows A). As a consequence of this pressure, at the contact points (i.e., at each interface 14 of wall 16 of clamp 12 and a bottom or an underside of the object MA), walls 16 deform, thereby generating stress in the X-direction. Second, the pressure of the vacuum deforms base 18 or bottom of clamp 12 displacing it towards the object MA, as depicted by arrow D in FIG. 5. As a consequence, end walls 16 are pulled close to a centerline X of clamp 12, as depicted by arrows C in FIG. 5. Both of these X-direction forces generate stress on clamp 12 of the support structure in the X-direction.

Based on the depictions in FIG. 5, for example, one can see why a chuck that is more flexible and compliant with a shape of an object (such as for non-flatness of the object in the Y-direction when a vacuum is applied) would be beneficial in the art to reduce and/or prevent slip and stress between the chuck and the object.

Figure 6A:
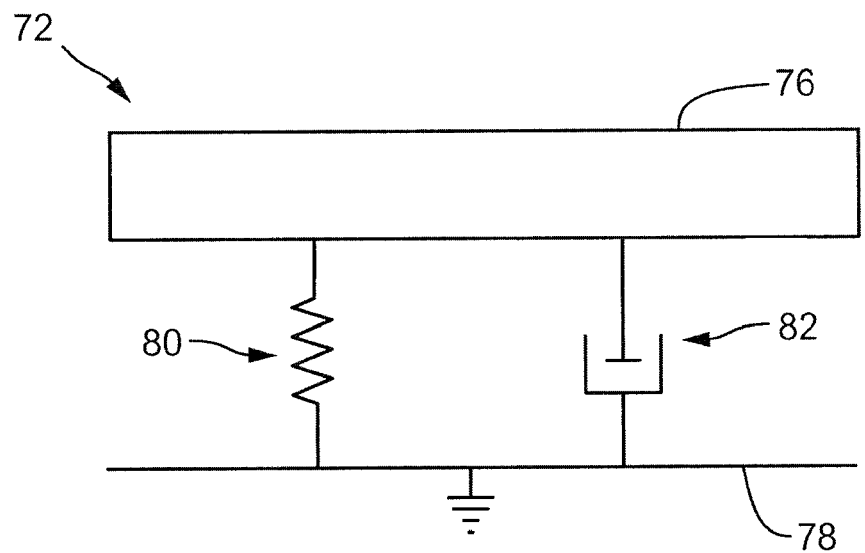
FIG. 6 illustrates control diagrams relating to the structures of FIGS. 3 and 7.
Figure 6B:
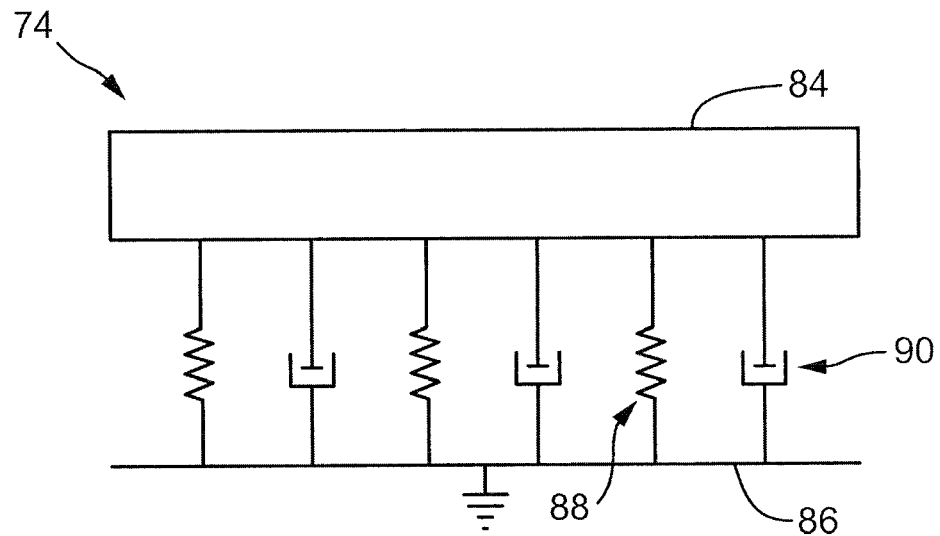

The local maximum allowable stress before slippage accounts for the in-plane resultant stress (in the X- and Y-directions) as depicted in FIG. 5, for example. FIG. 6 (a) illustrates an exemplary control diagram showing a known relationship between an object 76 (e.g., patterning device MA) and a ground device 78 (e.g., chuck 10) as provided by the related art depicted in FIGS. 2-5. As shown, object 76 generally has a connection to ground device 78 similar to that of a spring as represented at 80 and a diffused damping mechanism as represented by 82 (e.g., bond layers and support connection). This spring-damping component connection is generally on the X-side of the object. However, this connection and configuration as shown in FIG. 6 (a) generally causes the described stresses and slip between an object and device.

One method for attempting reducing and/or preventing slip is to increase or maximize the Y component (so that a higher acceleration is allowed) while ideally minimizing or zeroing the X component. In addition, by maintaining clamp compliancy to a shape of an exchangeable object, this allows for maximum acceleration-induced stress at an interface between a clamp/chuck and the object while still minimizing any other stress due to deformation. Also, by optimizing uniformity of friction stress over the whole contact surface, local early slip conditions may be avoided.

As will be further described below, the herein-described concept includes a plurality of clamp mechanisms 22, wherein each clamp mechanism 22 includes a number of smaller, local vacuum clamp sections 36, where each individual vacuum clamp section 36 is individually very stiff but relative motion between sections 36 is permitted to maintain compliancy. Each vacuum clamp section 36 provides its own vacuum volume to apply a localized clamping force to part of the object 30. Since each clamp mechanism 22 has a region with a smaller vacuum volume, as well as parts that have additional loads due to deformation of the components (on top of the object inertia), the chuck stiffness of those regions of the vacuum clamp sections 36 are designed accordingly, i.e., the vacuum clamp sections 36 are optimized to present a uniform stiffness to chuck 20 in order to avoid local high stresses (creating slip or microslip) at an interface between the chuck/clamp and exchangeable object.

FIGS. 7-12 depict a non-limiting example of a support structure MT for positioning and supporting an exchangeable object 30 according to an embodiment of the invention. Exchangeable object 30 may be a patterning device such as device MA, or a reticle, a substrate, or any other object. The embodiment depicted in FIGS. 7-12 may be a part of a lithographic apparatus, such as the apparatus of FIG. 1.

Support structure MT comprises a chuck 20. Chuck 20 may be integral in support structure MT (thus the support structure MT is essentially the chuck) or it may be (removably) mounted thereto. In general, devices and methods for mounting and moving the chuck (e.g., using a control apparatus) are known. In an embodiment, chuck 20 is a support structure to support exchangeable object 30 (e.g., patterning device MA) in a lithographic apparatus. Generally, chuck 20 is configured to hold and position the object 30 when the beam of radiation used to expose the substrate is projected in the lithographic apparatus. In one embodiment, chuck 20 is movable by positioner PM to move both the chuck and patterning device MA (or object 30) thereon.

Figure 7:
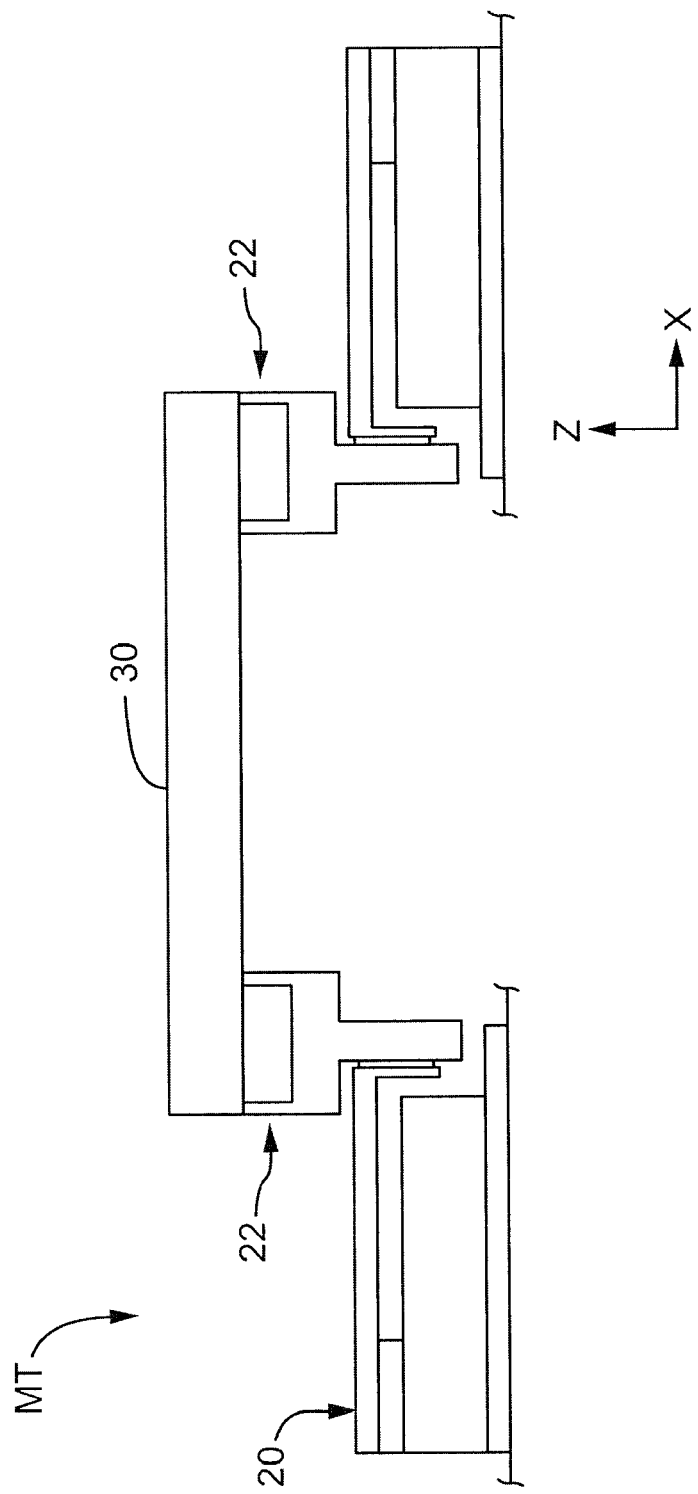
FIG. 7 schematically depicts an object supported by clamping mechanisms of a support structure in the apparatus of FIG. 1 according to an embodiment of the invention.

Support structure MT also comprises at least two clamp mechanisms 22 disposed on the chuck 20. Together, the at least two clamp mechanisms 22 may be considered a clamp assembly. As shown in FIG. 7, clamp mechanisms 22 are spaced from one another in a first direction, or an X-direction. Clamp mechanisms 22 are positioned to support exchangeable object 30 and apply a clamping force to the exchangeable object 30 to thereby hold the exchangeable object 30.

Figure 8:
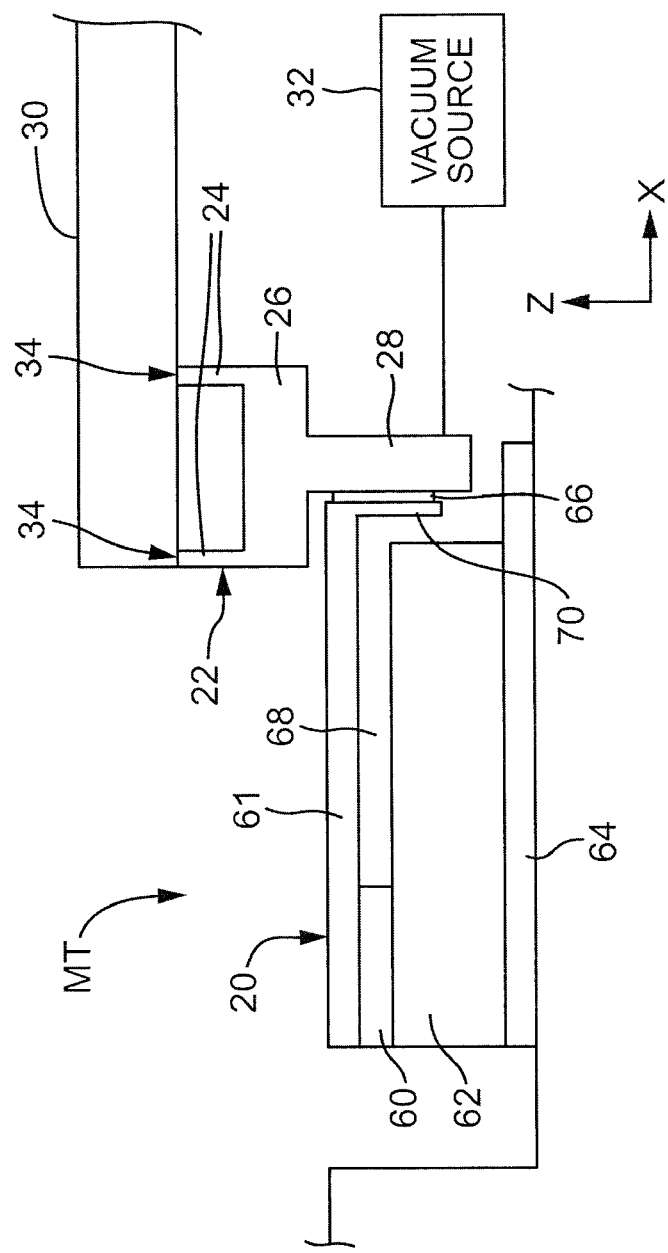
FIG. 8 schematically depicts a detailed, sectional view of one of the clamping mechanisms of the support structure according to an embodiment of the invention.

For explanatory and illustrative purposes only, FIG. 8 depicts a detailed, sectional view of a first (or left) side of chuck 20 in the form of support structure to support exchangeable object 30 in the apparatus of FIG. 1 (in the Z-X plane). In a similar manner as described above with respect to FIGS. 2 and 3, for example, in the illustrated embodiment, chuck 20 comprises a number of components connected by structural bonds. The bonds may be generally stiff to connect the components, for example. The bonds may comprise any number of materials and may also be damping or constraining elements (or layers) in chuck 20. In another embodiment, chuck 20 may comprise a single (one) component and thus bonds are not necessary. The illustrated chuck 20 comprises a carrier 62 which may be part of chuck 20 or rigidly connected via a bond 64 to a part (not shown) of chuck 20.

Figure 11:
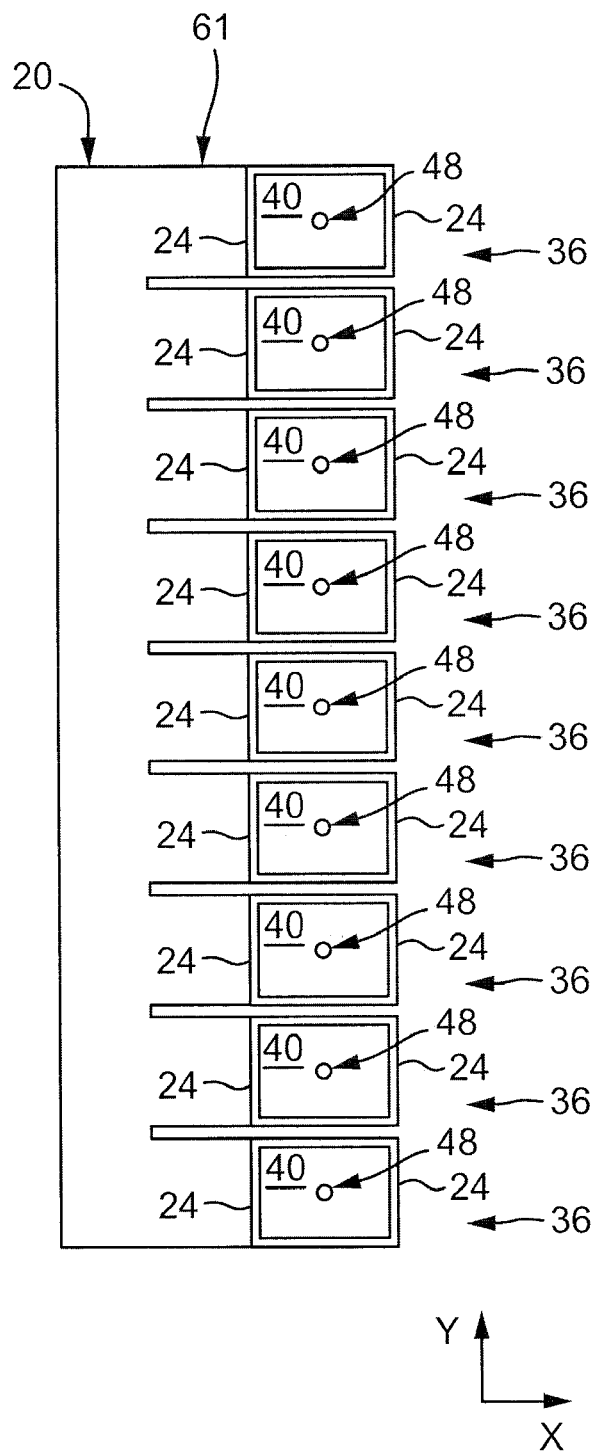

Chuck 20 may also comprise one or more leaf springs 61 that are connected to carrier 62 via one or more bonds 60, for example. In this illustrated embodiment, each leaf spring 61 comprises a vertical end 70 that is positioned perpendicular to the horizontal leaf spring section 63 to form an "L"-shape (i.e., end 70 extends vertically downward with respect to horizontal section 63, as shown in FIGS. 7 and 11, for example). Vertical end 70 is connected via a bond 66 to a vertical extension 28 of the clamp mechanism 22. The "L"-shape of leaf spring 61 provide greater flexibility in the Y-direction, which further allows for clamp mechanism 22 to easily move and/or rotate to comply with an object's unflatness and/or movement (when an object, such as object 30, is positioned and clamped thereon). Also shown in FIG. 8 is a gap 68 between leaf spring 61 and carrier 62 of chuck 20, which allows leaf spring 61 to absorb movement relative to chuck 20. In an embodiment, the stiffer each clamp mechanism (and its corresponding parts) is made, to more compliant leaf spring 61 may be formed. Moreover, greater flexibility and movement in leaf spring 61 can reduce parasitic forces on the leaf spring 61/chuck 20 (as compared to those that are formed when a standard leaf spring deforms, such as leaf spring 51 in FIG. 3).

In use, chuck 20 is constructed to hold exchangeable object 30. More specifically, chuck 20 has an object surface on which exchangeable object 30 may be mounted and clamped via clamp mechanisms 22. Clamp mechanisms 22 are configured to clamp object 30 to chuck 20 (or support structure MT) for use during a lithography process.

The clamp mechanisms can be provided with and/or be connected to a suitable controller or processor (not shown), which is configured to control the clamping and release of the object to/from the chuck 20 or support structure MT, for example. The controller can comprise suitable hardware and/or software (e.g., a computer, processor, microelectronics and other suitable controlling means) as will be clear to the person skilled in the art.

Clamp mechanisms 22 can be configured in various ways. In an embodiment, clamp mechanisms 22 are configured to clamp object 30 to chuck 20 via vacuum clamping. For example, the lithographic apparatus may comprise a vacuum source, schematically depicted as vacuum source 32 in FIGS. 8 and 9, to apply or communicate a low pressure (i.e., vacuum) via clamp mechanisms 22 to object 30 to hold object 30 in position (e.g., for exposure) and to reduce or prevent movement of the object 30. Additionally and/or alternatively to vacuum clamping, for example, clamp mechanisms 22 can be configured to provide electrostatic clamping, or electromagnetic clamping, or even mechanical clamping.

Figure 12:
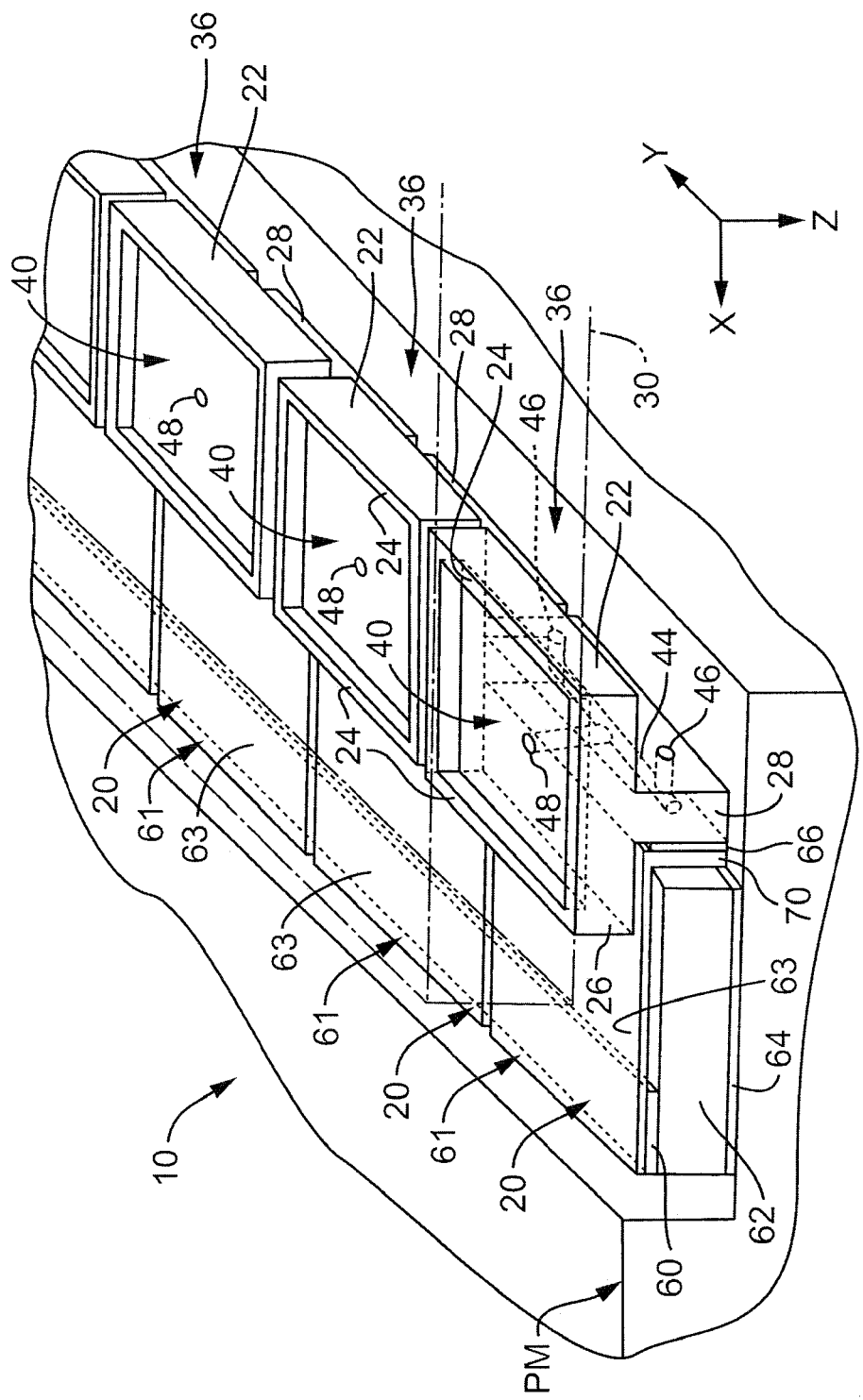
FIG. 12 schematically depicts a detailed, perspective view of vacuum sections of one of the clamp mechanisms of the support structure of FIGS. 7-11.

In order to reduce stress local stress at a clamp-object interface (as described previously) and prevent slip, support structure MT in the illustrated exemplary embodiment of FIGS. 7-12 includes several non-limiting features. In accordance with an embodiment, each clamp mechanism 22 comprises a plurality of separate, local, vacuum clamp sections 36 constructed and arranged to support exchangeable object 30 and apply a localized vacuum clamping force to the exchangeable object to hold exchangeable object 30 at a position with respect to chuck 20. FIG. 12 illustrates, in detail, a perspective view of the separate vacuum clamp sections 36 of clamp mechanism 22 on a first or left side of chuck 20. The separation between the vacuum sections 36 is in a second direction that is different from the first direction. In this illustrated embodiment, the vacuum sections 36 are separated from each other in the Y-direction, which is different from the first direction—the X-direction—in which clamp mechanisms 22 are spaced from one another.

It is noted that although only a left side of the clamp mechanism 22 is shown and described with respect to FIGS. 8-12, it is to be understood that a second side or a right side of the clamp mechanism 22 comprises similar separate vacuum sections 36, as depicted in the embodiment of FIG. 7, and may substantially be a mirror image of the schematically depicted left side of the clamp mechanism 22, and should not be limiting. For example, in an embodiment, more than two clamp mechanisms may be disposed on the chuck that are spaced from one another and that comprise separate vacuum sections.

Vacuum clamp sections 36 allow each clamp mechanism 22 to follow higher frequency non-flatness of the exchangeable object (e.g., during movement or acceleration) and provide greater adaptation to a shape of the object. In an embodiment, each clamp section 36 is separately formed. By providing multiple clamp sections for each clamp mechanism 22 along the Y-direction, the compliancy of clamp mechanism 22 during application of vacuum pressure is increased.

In accordance with an embodiment, a size of each vacuum clamp section 36 may be based upon an approximate size of the exchangeable object 30 to be place thereon. For example, if a reticle or patterning device of approximately 160 mm by approximately 160 mm is the object 30 to be clamped, ten (10) or more vacuum clamp sections 36 may be provided. In an embodiment, ten (10) or less clamp sections may be provided on each clamp mechanism. In one non-limiting example, each vacuum clamp section 36 may be approximately 10 mm to approximately 15 mm in the X-direction and approximately 10 mm to approximately 20 mm in the Y-direction. Such dimensions are not at all meant to be limiting.

Each of the vacuum clamp sections 36 are movable relative to one another to independently engage with the object 30 as a result of the relative flexibility of the associated leaf springs 61. Therefore, each vacuum section 36 can adapt to the object's shape and/or movement as needed. In an embodiment, the stiffness of each section 36 is proportional to a vacuum volume (represented by 40, discussed below) of each clamp mechanism 22. This allows for decoupling of the different sections 36 at an object-clamp interface 34. This permits a much finer tune of the local stiffness-vacuum area ratio, maximizing object slip performance.

More specifically, FIG. 6 (b) illustrates an exemplary control diagram that represents the below-described embodiment including vacuum clamp sections 36. With respect to shear stress that on the sections 36 of clamp mechanism 22 due to object inertia, FIG. 6 (b) represents how each vacuum clamp section 36 acts as separate spring and damping components 88 and 90 between an object 84 (e.g. object 30) and ground device 86 (e.g., chuck 20). Each clamp mechanism 22 is divided into a number of spring/damping components in parallel. This allows for each spring 88 to deform a similar amount in the same direction when the object 84 is accelerated (the object is not deforming while displacing in plane). As a result, the force applied on each clamp section of each clamp mechanism 22 by the relative spring 88 is proportional to the stiffness of the spring itself. In an embodiment, deformation is similar or the same for all of the springs and equal to object displacement.

If all of the spring and damping components 88 and 90 have similar stiffness, and all of the surface components (interfaces 34 of vacuum clamp sections 36) have the same area, they all will carry the same portion of object inertia and all will slip at the same time (since all have the same maximum allowable shear stress). This is the ideal case, allowing the maximum acceleration without slip. If some of the components have either a smaller surface, or a stiffer spring, they will slip first, and, since a slipping component does not carry any shear stress, the load that was on that component will now have to be carried by the remaining components. Depending on the number of components that slip, the load distribution will be more and more non-uniform between clamp sections 36, which may determine an early-slip condition.

As shown in greater detail in FIG. 12, each vacuum clamp section 36 is constructed and arranged to be in contact with a bottom or an underside of object 30 (shown in phantom lines) at object-clamp interface 34. Each vacuum clamp section 36 comprises four (4) walls 24 extending toward the exchangeable object that contact a bottom or an underside of object 30 when it is placed on clamp mechanisms 22. For example, an upper surface of each wall 24 contacts a bottom of object 30 at interface 34.

In an embodiment, to evenly distribute the friction stress induced by acceleration at the object-clamp interface 34, only outer or peripheral walls 24 are provided on each vacuum clamp section (e.g., see also FIGS. 7 and 8). Peripheral walls 24 have a lower stiffness with respect to chuck 20, and by reducing the number of walls, the stiffness of chuck 20 may be more uniform and more evenly distributed across the contact surface(s) at the object-clamp interface 34.

For example, as shown in the illustrated embodiment, peripheral walls 24 may be provided around a perimeter of each vacuum clamp section 36 to form a contact area (on the upper surfaces of the walls) and volume 40 for enclosure. In an embodiment, peripheral walls 24 form a square. However, peripheral walls 24 may form other shapes (e.g., rectangular or circular) or enclosures and are not meant to be limiting. In an embodiment, the shape and size of the peripheral walls is based on the shape and size of each vacuum clamp section 36.

When a part of an underside surface of object 30 is placed on upper surfaces of peripheral walls 24, volume 40 formed by peripheral walls 24 is enclosed and a vacuum can be applied to the local underside surface of object 30. The dimensions and/or size of volume 40 and of peripheral walls 24 may be based on the size of each clamp section 36, for example.

Figure 10:
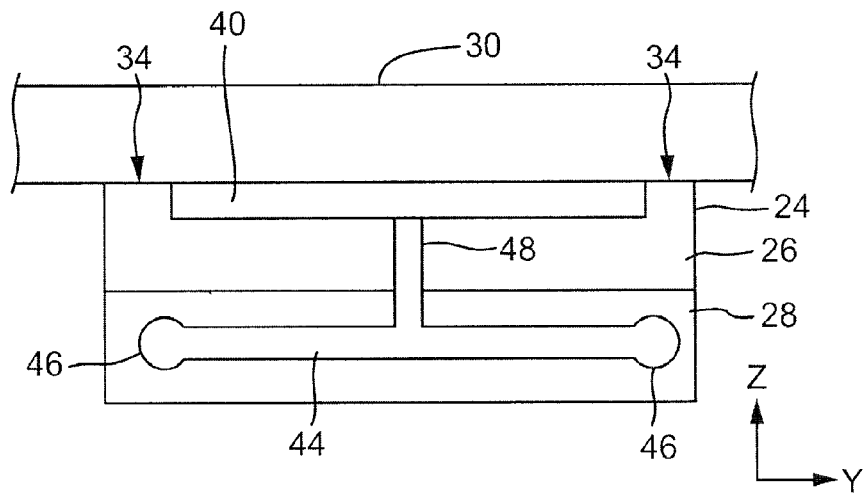

To enable vacuum pressure to be applied to exchangeable object 30, in an embodiment, each vacuum clamp section 36 further comprises at least one local vacuum channel 48 to communicate low vacuum pressure to hold exchangeable object 30 in position. For example, as shown in FIGS. 10 and 12, local vacuum channel 48 may extend through a base 26 of vacuum clamp section 36 toward vacuum volume 40. When the object 30 is positioned on clamp mechanisms 22 and vacuum pressure or force is applied, each vacuum volume 40 will be pressurized via at least channel 48 to apply local vacuum force to an underside area of the object 30.

Figure 9:
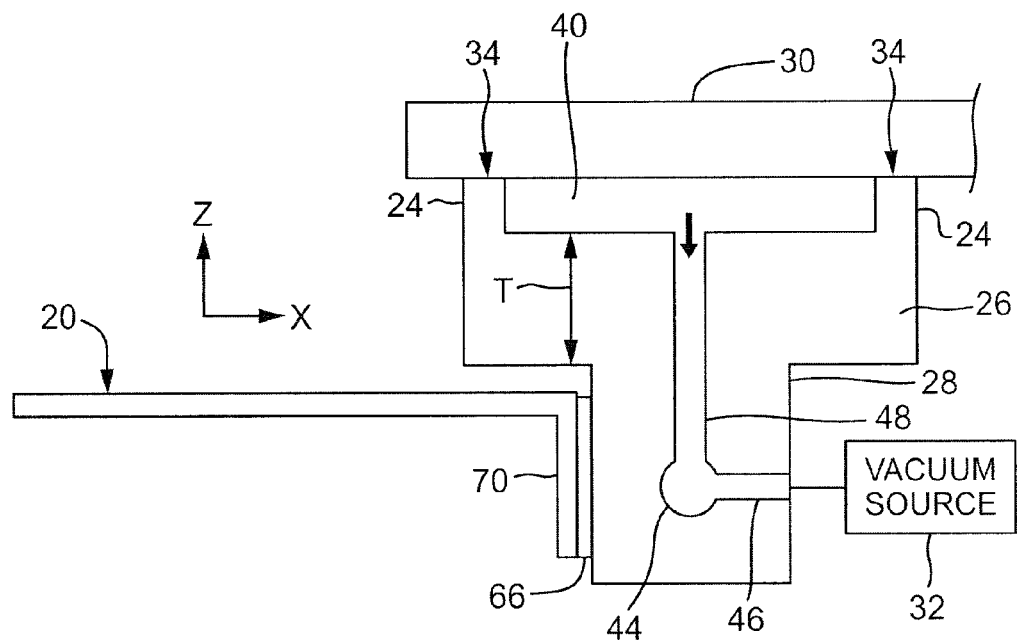
FIGS. 9-11 schematically depict detailed, sectional views of one of the clamp mechanisms of the support structure of FIG. 7 and a method to handle an object on the support structure according to an embodiment of the invention.

To bring vacuum pressure to each section 36 from vacuum source 32, each section 36 may comprise a plurality of channels 44 and 46 in communication with the at least one local vacuum channel 48. In an embodiment, to position the channels for vacuum application to volume 40, each section 36 of each clamp mechanism 22 comprises a "T"-shape formed by base 26 and vertical extension 28, such as shown in greater detail in FIGS. 9 and 12. The T-shape allows for any number of channels 44 and 46 to be positioned vertically and/or horizontally within each section 36 of each clamp mechanism 22, for example. In the illustrated embodiment, first channel 44 extends horizontally along a length of vertical extension 28 (in the Y-direction) and is in communication with the vertically extending local vacuum channel 48. Two second channels 46 are provided near ends of vertical extension 28 and are in communication with first channel 44. In an embodiment, as shown in FIG. 9, vacuum pressure may be provided by vacuum source 32 via second channels 46 in vertical extension 28 to second channel 44 and local vacuum channel 48, thereby applying vacuum force to volume 40. Thus, each section 36 may have the ability to provide a low pressure source to the exchangeable object 30 at its contact interface 34 (when positioned thereon).

In an embodiment, each first channel 44 of each vacuum clamp section 36 may be in communication with an adjacent first channel 44 of one or more adjacent vacuum clamp sections 36.

It should be noted that the illustrated channels are not meant to be limiting. Any number of channels 44, 46, and/or 48 may be provided in each vacuum clamp section 36. For example, in an embodiment, two local vacuum channels 48 may be provided. In another embodiment, first channel 44 need not be provided.

In an embodiment, the thickness T of base 26 of each section 36 of each clamp mechanism 22 may be of increased stiffness configured to inhibit deformation thereof upon application of a vacuum.

In an embodiment, thickness T of base 26 may be approximately greater than 0.3 mm. In an embodiment, thickness T may be approximately equal to or greater than 1.0 mm. In another embodiment, thickness T may be within a range between approximately 0.4 mm and approximately 1.0 mm.

Assuming each vacuum clamp section 36 is a single entity, the fraction of shear stress (due to the object's inertia) carried by each vacuum clamp section 36 is proportional to an allowable friction force at the interface 34 before slip (e.g. surface of interface*vacuum pressure*friction coefficient). Also, if it is assumed that the vacuum pressure and friction coefficient are the same for each vacuum clamp section 36, then the surface component (interface 34) could change the allowable friction force.

To use the herein described chuck 20 in a lithographic apparatus, exchangeable object 30 is positioned on clamp mechanisms 22 and a low pressure force may be applied via vacuum source 32 to secure object 30 in position in relation to chuck 20. After object 30 is secured to chuck 20, the scanning and exposure process may be started to expose a substrate in the lithographic apparatus. When the object is to be removed or exchanged, the low pressure force from vacuum source 32 is released. The object may then be lifted or removed.

The herein described exemplary embodiments are designed to improve slip and clamping behavior in general of exchangeable objects (e.g., patterning device MA or reticle) clamped by a chuck or support structure.

Besides the embodiments shown, it will be appreciated that numerous variant embodiments are possible. For example, it is to be understood that in embodiments chuck 20 may configured to hold a patterning device MA on the support structure (e.g., mask table) MT, or a substrate on the substrate table WT. The chuck may also be used to hold and position another object, such as a mirror, within the lithographic apparatus. The chuck described herein may be used in lithographic tools that do not contain projection optics, such as in an imprint lithography tool, in a maskless lithography tool, as well as in lithography tools with projection optics designs substantially different from this example.

Also, it is to be understood that clamps of greater width relative to the exchangeable object may also be used. Additionally and/or alternatively, in one or more embodiments, one or more pushers and/or slip sensors may be provided or adapted to fit with the depicted embodiments.

In an embodiment, there is provided a support structure for positioning an exchangeable object in a lithographic apparatus comprising: a chuck; and at least two clamp mechanisms disposed on the chuck, the clamp mechanisms being spaced from one another in a first direction, each clamp mechanism comprising a plurality of separate vacuum sections constructed and arranged to support the exchangeable object and apply a clamping force to the exchangeable object to hold the exchangeable object, the separation between vacuum sections being in a second direction different from the first direction.

In an embodiment, the exchangeable object is a patterning device. In an embodiment, each vacuum section is movable relative to adjacent vacuum sections. In an embodiment, each vacuum section further comprises a channel to communicate a low pressure to hold the exchangeable object in a position to prevent movement relative to the chuck. In an embodiment, each vacuum section further comprises a contact surface in contact with the exchangeable object. In an embodiment, the contact surface forms an volume arranged to apply a substantially constant low pressure force to hold the exchangeable object thereon. In an embodiment, the low pressure is provided by a vacuum source. In an embodiment, the second direction is perpendicular to the first direction.

In an embodiment, there is provided a lithographic apparatus arranged to transfer a pattern from a patterning device onto a substrate, the patterning device configured to provide a patterned beam of radiation, the apparatus comprising: an illumination system configured to provide a beam of radiation; a support structure configured to support the patterning device comprising the pattern; a projection system configured to project the patterned beam onto a target portion of the substrate; a substrate table configured to support the substrate; and at least two clamp mechanisms disposed on the support structure, the clamp mechanisms being spaced from one another in a first direction, each clamp mechanism comprising a plurality of separate vacuum sections constructed and arranged to support the patterning device and apply a clamping force to the patterning device to hold the patterning device, the separation between vacuum sections being in a second direction different from the first direction.

In an embodiment, the exchangeable object is a patterning device. In an embodiment, each vacuum section is movable relative to adjacent vacuum sections. In an embodiment, each vacuum section further comprises a channel to communicate a low pressure to hold the patterning device in a position to prevent movement relative to the support structure. In an embodiment, each vacuum section further comprises a contact surface in contact with the patterning device. In an embodiment, the contact surface forms a volume arranged to apply a substantially constant low pressure force to hold the patterning device thereon. In an embodiment, the low pressure is provided by a vacuum source. In an embodiment, the second direction is perpendicular to the first direction.

In an embodiment, there is provided a method for positioning an object within a lithographic apparatus, the method comprising: loading the object onto a chuck of the lithographic apparatus and applying a clamping force to the object to hold the object, wherein the clamping force is applied by at least two clamp mechanisms disposed on the chuck, the clamp mechanisms being spaced from one another in a first direction, each clamp mechanism comprising a plurality of separate vacuum sections constructed and arranged to support the exchangeable object and apply the clamping force, the separation between vacuum sections being in a second direction different from the first direction.

In an embodiment, the object is a patterning device. In an embodiment, each vacuum section further comprises a channel to communicate a vacuum pressure from a vacuum source to the object, and wherein the method further comprises applying the vacuum pressure to each vacuum section to hold the object at a position to prevent movement relative to the chuck. In an embodiment, the second direction is perpendicular to the first direction.

In an embodiment, there is provided a clamp assembly for holding an exchangeable object in a lithographic apparatus comprising: at least two clamp mechanisms spaced from one another in a first direction, each clamp mechanism comprising a plurality of separate vacuum sections constructed and arranged to support the exchangeable object and apply a clamping force to the exchangeable object to hold the exchangeable object, the separation between vacuum sections being in a second direction different from the first direction.

In an embodiment, the exchangeable object is a patterning device. In an embodiment, each vacuum section is movable relative to adjacent vacuum sections. In an embodiment, each vacuum section further comprises a channel to communicate a low pressure to hold the exchangeable object in a position to prevent movement. In an embodiment, each vacuum section further comprises a contact surface in contact with the exchangeable object. In an embodiment, the contact surface forms an volume arranged to apply a substantially constant low pressure force to hold the exchangeable object thereon. In an embodiment, the low pressure is provided by a vacuum source. In an embodiment, the second direction is perpendicular to the first direction.

In an embodiment, there is provided a support structure for positioning an exchangeable object in a lithographic apparatus comprising: a chuck; and a clamp mechanism on the chuck, the clamp mechanism comprising a plurality of clamp sections constructed and arranged to support the exchangeable object and apply a clamping force to the exchangeable object to hold the exchangeable object.

In an embodiment, there is provided a lithographic apparatus arranged to transfer a pattern from a patterning device onto a substrate, the patterning device configured to provide a patterned beam of radiation, the apparatus comprising: a chuck; and a clamp mechanism on the chuck, the clamp mechanism comprising a plurality of clamp sections constructed and arranged to support the exchangeable object and apply a clamping force to the exchangeable object to hold the exchangeable object.

In an embodiment, the apparatus further comprises a substrate table configured to hold a substrate; and a projection system configured to project the patterned beam onto a target portion of the substrate.

In an embodiment, there is provided a method for positioning an object within a lithographic apparatus, the method comprising: loading the object onto a chuck of the lithographic apparatus and applying a clamping force to the object to hold the object, wherein the clamping force is applied by at least one clamping mechanism that is divided into a plurality of sections, each section being movable relative to adjacent sections and constructed and arranged to support the object.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The lithographic apparatus may also be of a type wherein a surface of the substrate is immersed in a liquid having a relatively high refractive index, e.g. water, so as to fill a space between a final element of the projection system and the substrate. Immersion liquids may also be applied to other spaces in the lithographic apparatus, for example, between the patterning device and a first element of the projection system. Immersion techniques are well known in the art for increasing the numerical aperture of projection systems.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions configured to cause performance of a method as disclosed above, or a computer-readable data storage medium (e.g. semiconductor memory, magnetic or optical disk) having such a computer program stored therein.

The descriptions above are intended to be illustrative, not limiting. Thus, it will be apparent to those skilled in the art that modifications may be made to the invention as described without departing from the scope of the claims set out below.

What is claimed is:

1. A support structure for positioning an exchangeable object in a lithographic apparatus, the support structure comprising:
    a chuck; and
    at least two clamp mechanisms disposed on the chuck, the clamp mechanisms being spaced from one another in a first direction, each clamp mechanism comprising a plurality of separate vacuum sections constructed and arranged to support the exchangeable object and apply a clamping force to the exchangeable object to hold the exchangeable object, the separation between vacuum sections being in a second direction different from the first direction, wherein each vacuum section of a respective clamp mechanism is movable relative to an adjacent vacuum section of the respective clamp mechanism in the second direction.

2. The support structure of claim 1, wherein the exchangeable object is a patterning device.

3. The support structure of claim 1, wherein each vacuum section further comprises a channel to communicate a low pressure to hold the exchangeable object in a position to prevent movement relative to the chuck.

4. The support structure of claim 1, wherein each vacuum section further comprises a contact surface in contact with the exchangeable object.

5. The support structure of claim 4, wherein each vacuum section forms a volume arranged to apply a substantially constant low pressure force to hold the exchangeable object thereon, wherein the volume is open to the exchangeable object at the contact surface.

6. The support structure of claim 1, wherein the second direction is perpendicular to the first direction.

7. A lithographic apparatus arranged to transfer a pattern from a patterning device onto a substrate, the patterning device configured to provide a patterned beam of radiation, the apparatus comprising:
    a support structure configured to support the patterning device comprising the pattern;
    a projection system configured to project the patterned beam onto a target portion of the substrate;
    a substrate table configured to support the substrate; and
    at least two clamp mechanisms disposed on the support structure, the clamp mechanisms being spaced from one another in a first direction, each clamp mechanism comprising a plurality of separate vacuum sections constructed and arranged to support the patterning device and apply a clamping force to the patterning device to hold the patterning device, the separation between vacuum sections being in a second direction different from the first direction, wherein each vacuum section of a respective clamp mechanism is movable relative to an adjacent vacuum section of the respective clamp mechanism in the second direction.

8. A method for positioning an object within a lithographic apparatus, the method comprising:
    loading the object onto a chuck of the lithographic apparatus; and
    applying a clamping force to the object to hold the object, wherein the clamping force is applied by at least two clamp mechanisms disposed on the chuck, the clamp mechanisms being spaced from one another in a first direction, each clamp mechanism comprising a plurality of separate vacuum sections constructed and arranged to support the exchangeable object and apply the clamping force, the separation between vacuum sections being in a second direction different from the first direction, wherein each vacuum section of a respective clamp mechanism is movable relative to an adjacent vacuum section of the respective clamp mechanism in the second direction.

9. The method of claim 8, wherein each vacuum section further comprises a channel to communicate a vacuum pressure from a vacuum source to the object, and wherein the method further comprises applying the vacuum pressure to each vacuum section to hold the object at a position to prevent movement relative to the chuck.

10. The method of claim 8, wherein the second direction is perpendicular to the first direction.

11. A clamp assembly for holding an exchangeable object in a lithographic apparatus, the clamp assembly comprising:
    at least two clamp mechanisms spaced from one another in a first direction, each clamp mechanism comprising a plurality of separate vacuum sections constructed and arranged to support the exchangeable object and apply a clamping force to the exchangeable object to hold the exchangeable object, the separation between vacuum sections being in a second direction different from the first direction, wherein each vacuum section of a respective clamp mechanism is movable relative to an adjacent vacuum section of the respective clamp mechanism in the second direction.

12. The clamp assembly of claim 11, wherein each vacuum section further comprises a channel to communicate a low pressure to hold the exchangeable object in a position to prevent movement.

13. The clamp assembly of claim 11, wherein each vacuum section further comprises a contact surface in contact with the exchangeable object.

14. The clamp assembly of claim 11, wherein the second direction is perpendicular to the first direction.

15. A support structure for positioning an exchangeable object in a lithographic apparatus, the support structure comprising:
   a chuck; and
   an elongate clamp mechanism on the chuck, the clamp mechanism comprising at least three clamp sections, arranged along the direction of elongation, constructed and arranged to support the exchangeable object and apply a clamping force to the exchangeable object to hold the exchangeable object, wherein at least one of the clamp sections is separated by open gaps located respectively at opposite sides, along the direction, of the at least one clamp section from respective adjacent clamp sections, each adjacent clamp section arranged at an opposite side, along the direction, of the at least one clamp section.

16. The support structure of claim 15, wherein each clamp section is movable relative to an adjacent clamp sections located along the direction.

17. A lithographic apparatus arranged to transfer a pattern from a patterning device onto a substrate, the patterning device configured to provide a patterned beam of radiation, the apparatus comprising:
   a chuck; and
   an elongate clamp mechanism on the chuck, the clamp mechanism comprising at least three clamp sections, arranged along the direction of elongation, constructed and arranged to support the exchangeable object and apply a clamping force to the exchangeable object to hold the exchangeable object, wherein at least one of the clamp sections is separated by open gaps located respectively at opposite sides, along the direction, of the at least one clamp section from respective adjacent clamp sections, each adjacent clam section arranged at an opposite side, along the direction, of the at least one clamp section.

18. The apparatus of claim 17, further comprising:
   a substrate table configured to hold a substrate; and
   a projection system configured to project the patterned beam onto a target portion of the substrate.

19. The apparatus of claim 17, wherein each clamp section is movable relative to an adjacent clamp sections located along the direction.

20. A method for positioning an object within a lithographic apparatus, the method comprising:
   loading the object onto a chuck of the lithographic apparatus; and
   applying a clamping force to the object to hold the object, wherein the clamping force is applied by at least one elongate clamping mechanism that is divided into a plurality of sections along the direction of elongation, each section being movable relative to an adjacent section in the direction of elongation and constructed and arranged to support the object.

* * * * *

UNITED STATES PATENT AND TRADEMARK OFFICE
CERTIFICATE OF CORRECTION

PATENT NO. : 9,274,439 B2
APPLICATION NO. : 13/168109
DATED : March 1, 2016
INVENTOR(S) : Enrico Zordan It is certified that error appears in the above-identified patent and that said Letters Patent is hereby corrected as shown below:

On Title Page 2, Item (56) References Cited - Foreign Patent Documents, Column 2
replace "WO    99/24889    5/1999"
with --WO    99/24869    5/1999--.

Signed and Sealed this
Twenty-first Day of June, 2016

Michelle K. Lee
*Director of the United States Patent and Trademark Office*